United States Patent
Lu

(10) Patent No.: US 8,119,427 B1
(45) Date of Patent: Feb. 21, 2012

(54) LIGHT EMITTING DIODE DIE-BONDING WITH MAGNETIC FIELD

(75) Inventor: Tsung-Hung Lu, Tainan County (TW)

(73) Assignee: Chi Mei Lighting Technology Corporation, Tainan County (TW)

( * ) Notice: Subject to any disclaimer, the term of this patent is extended or adjusted under 35 U.S.C. 154(b) by 0 days.

(21) Appl. No.: 12/985,992

(22) Filed: Jan. 6, 2011

(51) Int. Cl.
*H01L 21/00* (2006.01)

(52) U.S. Cl. .................. 438/26; 438/119; 257/E21.514; 257/E21.515

(58) Field of Classification Search ................ 438/2, 25, 438/26, 51, 57, 64, 106, 795, FOR. 333, FOR. 410, 438/FOR. 416; 257/E21.514, E21.515, E21.499, 257/E21.5
See application file for complete search history.

(56) References Cited

U.S. PATENT DOCUMENTS

2006/0131712 A1* 6/2006 Jerebic et al. ................. 257/684
2007/0194676 A1* 8/2007 Tanda et al. ................... 313/110
* cited by examiner

*Primary Examiner* — Julio J Maldonado
*Assistant Examiner* — Quovaunda V Jefferson
(74) *Attorney, Agent, or Firm* — Morris Manning & Martin LLP; Tim Tingkang Xia, Esq.

(57) ABSTRACT

In one aspect of the present invention, a method of LED die-bonding includes coating the back side of an LED chip with a magnetic material, placing the LED chip in a packaging cup such that the back side of the LED chip is in contact with the bottom of the packaging cup, applying a magnetic field in a region near the bottom of the packaging cup so as to exert a magnetic force on the LED chip via the magnetic material coated on the back side of the LED chip, thereby holding the LED chip in place against the bottom of the packaging cup, while the magnetic field is applied, bonding one end of a first conductive wire to an anode of the LED and the other end of the first conductive wire to a first electrode, and bonding one end of a second conductive wire to a cathode of the LED and the other end of the second conductive wire to a second electrode, where the first electrode and the second electrode are attached to the packaging cup, and filling the packaging cup with an epoxy, and curing the epoxy.

22 Claims, 5 Drawing Sheets

LIGHT EMITTING DIODE DIE-BONDING WITH MAGNETIC FIELD

CROSS-REFERENCE TO RELATED PATENT APPLICATION

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates to light emitting diode (LED) die-bonding, more particularly to LED die-bonding with a magnetic field.

BACKGROUND OF THE INVENTION

In recent years, commercial applications of LEDs have been continuously expanding. In particular, LEDs are increasingly used for white light illumination because of the awareness of global warming. LED packaging is an important aspect for LED applications. Among other things, the functions of the LED packaging include insuring proper electrical connections to the anode and cathode of the LED, and protecting the LED chip from mechanical, thermal, and humidity impact from the environment. Selecting an LED packaging method for a particular application depends on the physical shape and electrical characteristics of the LED, as well as their optical properties. As new applications of LEDs are being developed, there are also new challenges in packaging methods. As an important aspect of the LED packaging, die-bonding is perhaps the first challenge that one faces for high power LED applications.

There are two die-bonding methods that are widely used in the LED industry: epoxy die bonding and eutectic die-bonding. FIG. 4 illustrates the method of the epoxy die-bonding. In step 302, an amount of a first epoxy 342 is applied to the bottom of a packaging cup 324 using a dispenser 340. In step 304, an LED chip 320 is placed into the packaging cup 324. In step 306, the back side of the LED chip 320 is pressed into the epoxy 342. The assembly, including the packaging cup 324, the LED chip 320, and the epoxy 342, is baked at approximately 150° C. for about one to two hours to cure the first epoxy thereby to fix the LED chip 320 in the packaging cup. In step 308, a first conductive wire 328 is bonded to the anode of the LED at one end thereof and to a first electrode (not shown) at the other end thereof. A second conductive wire 329 is bonded to the cathode of the LED at one end thereof and to a second electrode (not shown) at the other end thereof. The first electrode and the second electrode are attached to the packaging cup 324. At step 310, the packaging cup is filled with a second epoxy 330 to immerse the LED chip 320, the first conductive wire 328, and the second conductive wire 329 therein. The assembly is then baked again to cure the second epoxy.

The epoxy die-bonding is widely used for low power LEDs in small size products or backlight products. The first epoxy used to attach the LED chip to the packaging cup can be either epoxy resin or silicon epoxy, each of which has a thermal conductivity coefficient around 5 W/mK. In some products, for example illumination products or quarternary products, some silver power is added into the first epoxy to improve its electrical and thermal conductivity. Silver epoxy can have a thermal conductivity coefficient of about 20 W/mK at most. The main disadvantages of the epoxy die-bonding are the relatively low thermal conductivity it can achieve and the relatively long baking time required for curing the first epoxy.

For applications using high power LEDs, new die-bonding techniques are developed. Among them is a eutectic die-bonding method. FIG. 5 illustrates the method of the eutectic die-bonding. In step 402, the back side of an LED chip 420 is coated with a thin metal layer 422 such as gold (Au), tin (Sn), or Au—Sn alloy. In step 404, the LED chip 420 is placed into a packaging cup 424. The interior surface of the bottom of the packaging cup 424 is coated with a metal such as Au or silver (Ag). In step 406, the LED chip 420 is positioned in the packing cup 424 such that the back side of the LED chip 420 is in contact with the bottom of the packaging cup 424. The assembly, including the packaging cup 424 and the LED chip 420, is heated to a temperature above about 230° C. As the Au or Ag coated on the bottom of the packaging cup 424 melts and penetrates into the metal layer 422 on the back side of the LED chip 420, the melting point of the alloy increases causing the alloy to solidify, thereby fixing the LED chip 420 in the packaging cup 424. In step 408, conductive wires 428 and 429 are bonded to the anode and cathode of the LED, respectively. In step 410, the packaging cup is filled with an epoxy 430. The assembly is then baked at an elevated temperature for a duration of time effective to cure the epoxy. The eutectic die-bonding can achieve a thermal conductivity coefficient as high as 60 W/mK, far superior than what the epoxy die-bonding can achieve. However, the eutectic die-bonding involves relatively complicated processes and requires expensive equipment. In addition, the thermal properties of the LED chip and the substrate also need to be taken into consideration.

Therefore, a heretofore unaddressed need exists in the art to address the aforementioned deficiencies and inadequacies.

SUMMARY OF THE INVENTION

The present invention, in one aspect, relates to a method of LED die-bonding with magnetic field. In one embodiment, the method includes the steps of coating the back side of an LED chip with a magnetic material, placing the LED chip in a packaging cup having a bottom such that the back side of the LED chip is in contact with the bottom of the packaging cup, applying a magnetic field in a region near the bottom of the packaging cup so as to exert a magnetic force on the LED chip via the magnetic material coated on the back side of the LED chip, thereby holding the LED chip in place against the bottom of the packaging cup, while the magnetic field is applied, bonding one end of a first conductive wire to an anode of the LED and the other end of the first conductive wire to a first electrode, and bonding one end of a second conductive wire to a cathode of the LED and the other end of the second conductive wire to a second electrode, wherein the first electrode and the second electrode are attached to the packaging cup, removing the magnetic field, filling the packaging cup with an epoxy, and curing the epoxy.

The method may further include the step of, before the step of coating the back side of the LED chip with a magnetic material, coating the back side of the LED chip with a reflective material, such as aluminum (Al) or Au, by using evaporation or sputtering.

In one embodiment, the magnetic material comprises iron (Fe), cobalt (Co), nickel (Ni), manganese (Mn), or any combination thereof.

In one embodiment, the magnetic field is provided by an electromagnet or a permanent magnet.

In one embodiment, the coating step is performed using evaporation or sputtering.

In one embodiment, the placing step includes the step of positioning the LED chip in a predetermined position at the bottom of the packaging cup.

In another embodiment, the curing step is performed by baking the packaging cup with the LED chip and the epoxy therein at an elevated temperature for a duration of time effective for curing the epoxy.

In yet another embodiment, the first electrode and the second electrode are integrally formed in the packaging cup and are electrically insulated from each other by an insulating material.

In another aspect, the present invention relates to a method of LED die-bonding with magnetic field. In one embodiment, the method includes the same steps as in the method set forth immediately above except that the filling step and the curing step are performed while the magnetic field is applied.

In yet another aspect, the present invention relates to a method of LED die-bonding. In one embodiment, the method includes the steps of placing an LED chip onto a substrate such that the back side of the LED chip is in contact with the substrate, wherein the back side of the LED chip is coated with a magnetic material, applying a magnetic field in a region near the bottom of the substrate so as to exert a magnetic force on the LED chip via the magnetic material coated on the back side of the LED chip, thereby holding the LED chip in place against the substrate, and while the magnetic field is applied, bonding one end of a first conductive wire to an anode of the LED and the other end of the first conductive wire to a first electrode, and bonding one end of a second conductive wire to an cathode of the LED and the other end of the second conductive wire to a second electrode, wherein the first electrode and the second electrode are attached to the substrate.

In addition, the method further includes the steps of, after the bonding steps, dispensing an amount of epoxy over the LED chip and curing the epoxy.

Furthermore, the method may include the step of, after the bonding steps and before the dispensing and the curing steps, removing the magnetic field.

The substrate is a submount, a heat sink, or a packaging cup. The magnetic material comprises Fe, Co, Ni, Mn, or any combination thereof.

In one embodiment, the placing step includes the step of positioning the LED chip in a predetermined position on the substrate.

In one embodiment, the dispensing and the curing steps are performed while the magnetic field is applied.

In another embodiment, the first electrode and the second electrode are integrally formed in the substrate and are electrically insulated from each other by an insulating material.

In a further embodiment, the back side of the LED chip is coated with a reflective material under the magnetic material.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
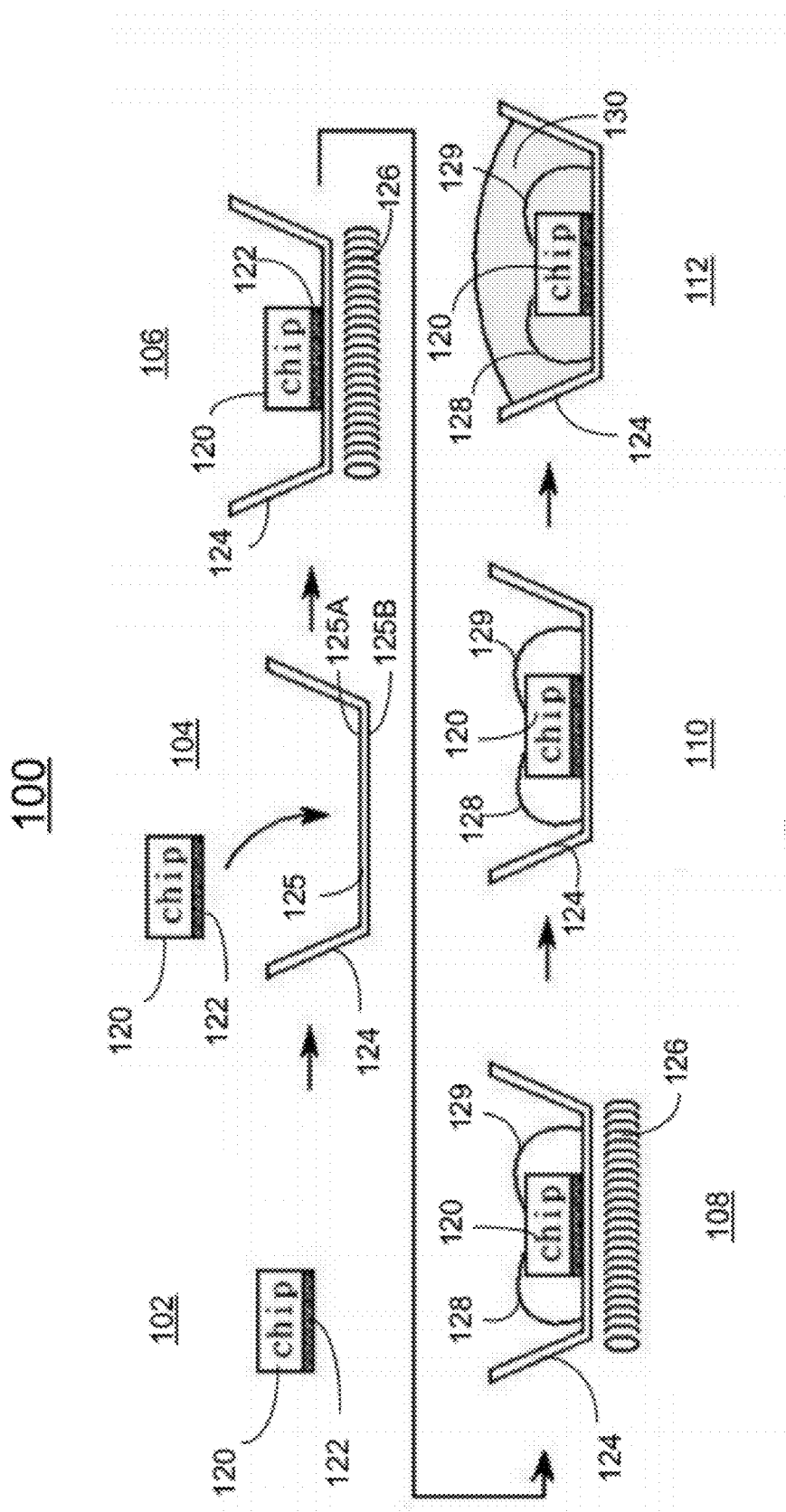
FIG. 1 illustrates a method of LED die-bonding with magnetic field according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings in FIGS. 1-3. In accordance with the purposes of this invention, as embodied and broadly described herein, this invention, in one aspect, relates to a method of LED die-bonding with a magnetic field.

FIG. 1 illustrates a method of LED die-bonding with magnetic field according to one embodiment of the present invention. In step 102, the back side of an LED chip 120 is coated with a thin layer of a magnetic material 122 such as Fe, Co, Ni, Mn, or any combination thereof, by using evaporation, sputtering, or other coating methods. In step 104, the LED chip 120 is placed into a packaging cup 124 with a bottom 125 having an interior surface 125A and an exterior surface 125B. The LED chip 120 is positioned in a predetermined position at the bottom of the packaging cup 124 using a vacuum pick-up device (not shown) or other type of pick-up device, such that the back side of the LED chip 120 is in contact with the interior surface 125A of the bottom 125 of the packaging cup 124. In step 106, a magnetic field is applied in the region proximate to the exterior surface 125B of the bottom 125 of the packaging cup 124 so as to exert a magnetic force on the LED chip 120 via the magnetic material 122 coated on the back side of the LED chip 120, thereby holding the LED chip 120 in place against the bottom 125 of the packaging cup 124. The magnetic field can be applied by turning on an electromagnet 126 placed under the packaging cup 124 as shown in FIG. 1, or by placing a permanent magnet under the packaging cup 124. In one embodiment, the method further includes the step of, before coating the back side of the LED chip 120 with a magnetic material 122, coating the back side of the LED chip 120 with a reflective material, such as Al or Au, to prevent the magnetic material from absorbing light. The reflective material may be coated using evaporation, sputtering, or other coating methods.

Figure 3:
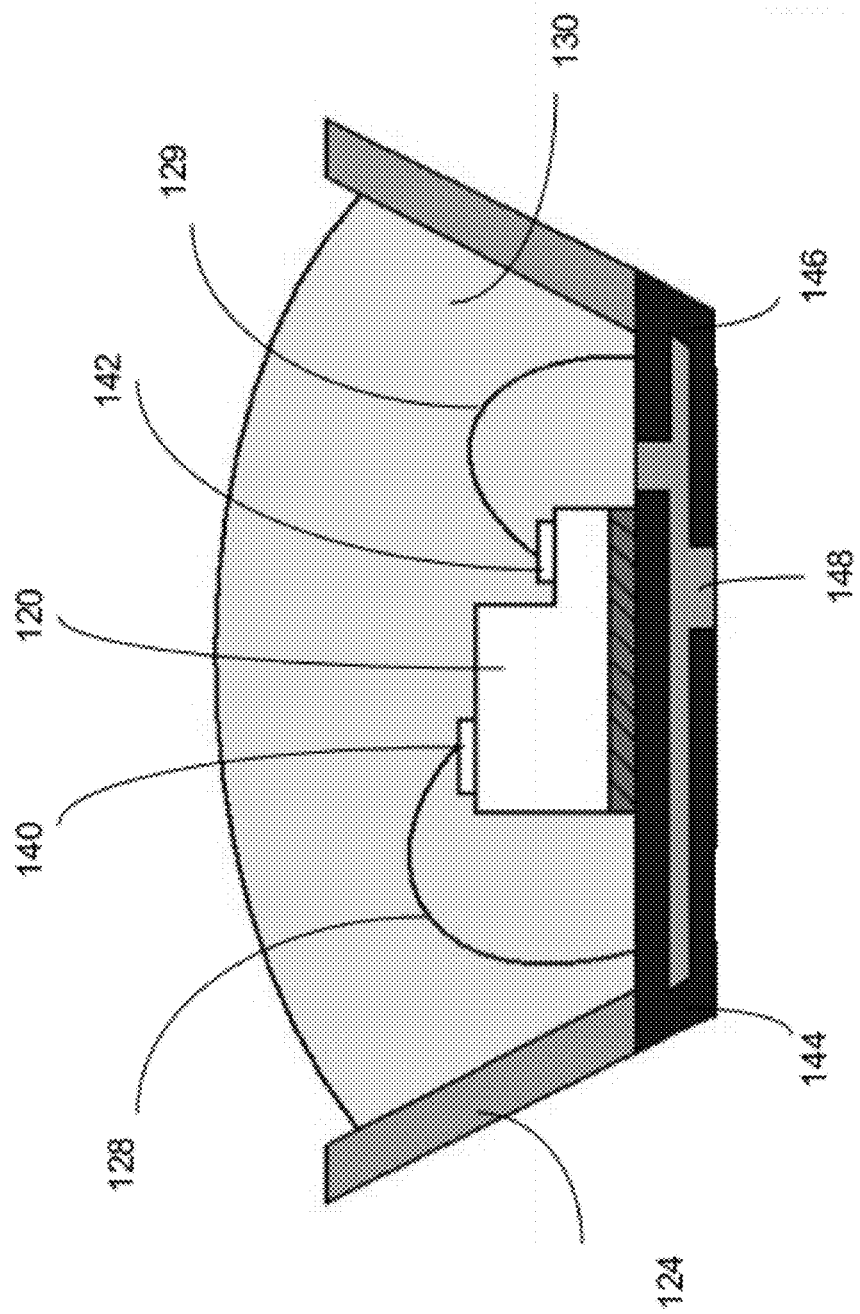
FIG. 3 shows schematically an LED chip bonded in a packaging cup according to one embodiment of the present invention.
Figure 4:
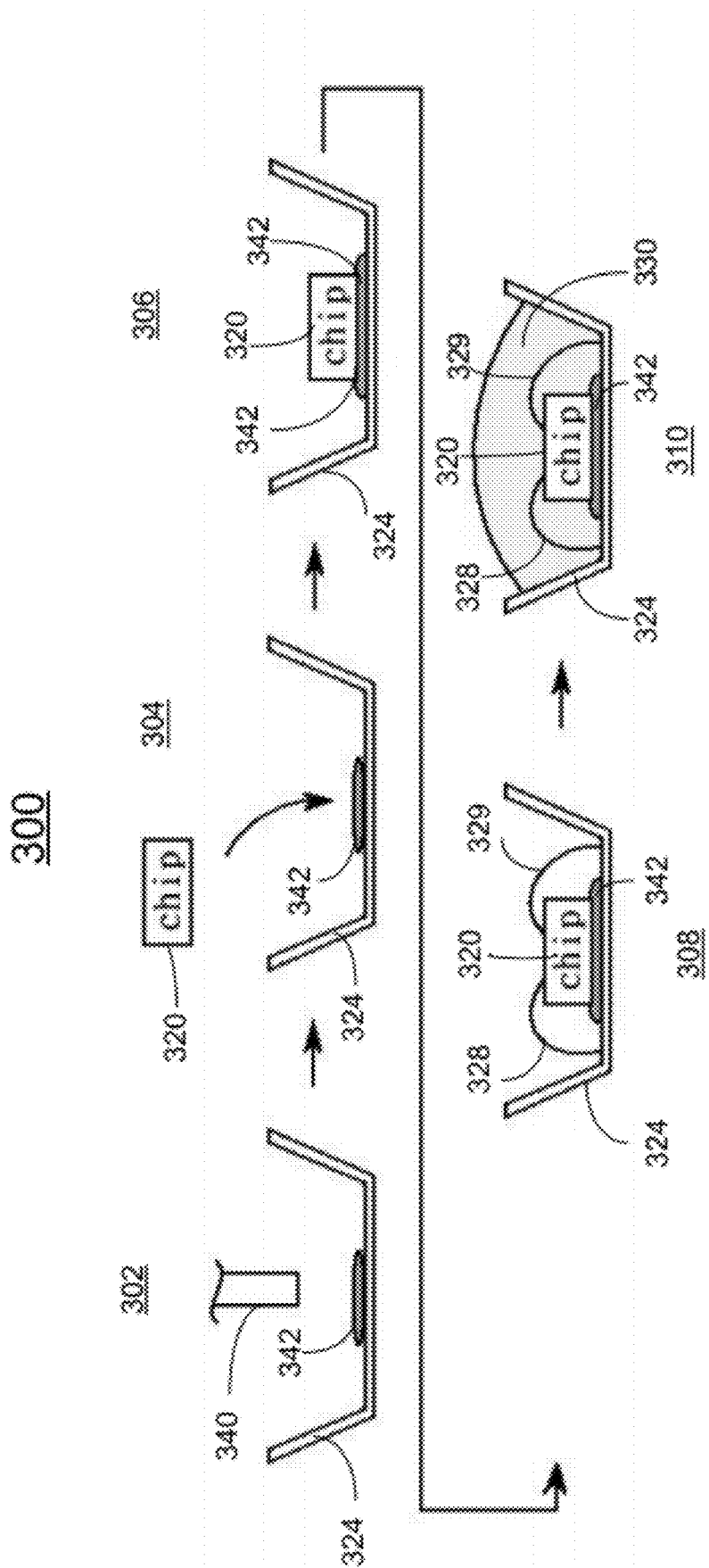
FIG. 4 illustrates a conventional method of LED die-bonding using epoxy.
Figure 5:
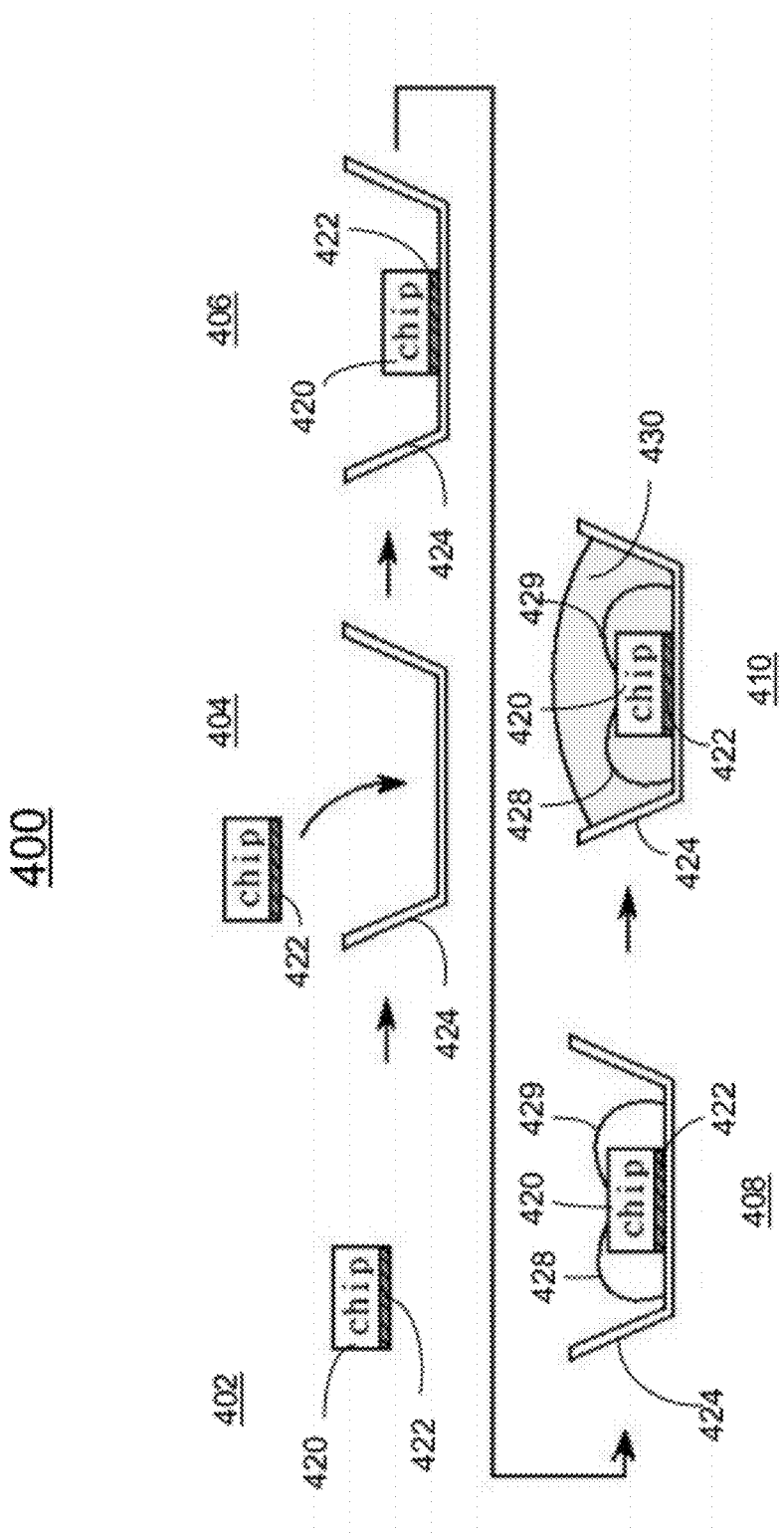
FIG. 5 illustrates a conventional method of LED die-bonding using eutectic soldering.

Referring to FIGS. 1 and 3, in step 108, while the magnetic field is applied, a first conductive wire 128 is bonded to an anode 140 of the LED at one end thereof and to a first electrode 144 at the other end thereof. A second conductive wire 129 is bonded to a cathode 142 of the LED at one end thereof and to a second electrode 146 at the other end thereof. In one embodiment, the first electrode 144 and the second electrode 146 are integrally formed in the packaging cup 124 as shown in FIG. 3. The first electrode 144 and the second electrode 146 are electrically insulated from each other by an insulating material 148. At step 110, the magnetic field is removed either by turning off the electromagnet or removing the permanent magnet away from the packaging cup 124. At step 112, the packaging cup is filled with an epoxy 130. The assembly is then baked at an elevated temperature for a duration of time effective to cure the epoxy.

Figure 2:
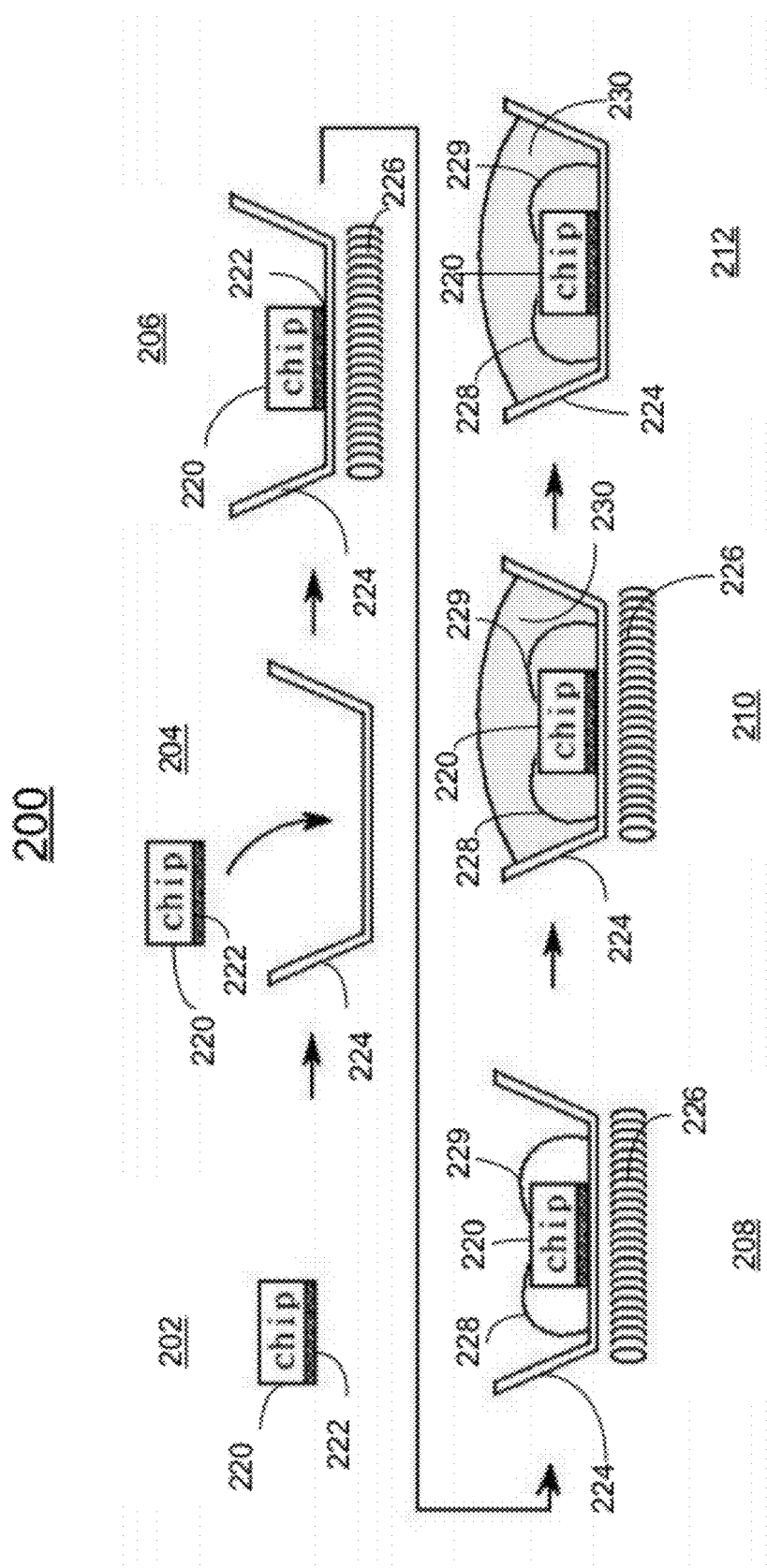
FIG. 2 illustrates the method of LED die-bonding with magnetic field according to another embodiment of the present invention.

FIG. 2 illustrates a method of LED die-bonding with magnetic field according to another embodiment of the present invention. In this embodiment, steps 202-208 are similar to steps 102-108 in the previous embodiment described immediately above and shown in FIG. 1. In step 210, while the magnetic field is applied, the packaging cup 224 is filled with an epoxy 230. The assembly is baked at an elevated temperature for a duration of time effective to cure the epoxy 230. In step 212, the magnetic field is removed after the die-bonding process is completed. In this embodiment, because the magnetic field is kept on while the epoxy is applied and cured, the LED chip 220 is more stably fixed in the packaging cup 224 compared to the previous embodiment. In addition, this embodiment also ensures that the LED chip 220 is in good thermal contact with the bottom of the packaging cup 224, thus ensuring good thermal conductivity; whereas, in the previous embodiment, because the magnetic field is removed before the epoxy is applied and cured, the contact between the back side of the LED chip 220 and the bottom of the packaging cup 224 may not be maintained when the epoxy is applied and cured, which may result in poor thermal conductivity. In both embodiments, LED chips can also be directly mounted onto a submount or a heat sink.

Compared to the conventional methods of epoxy die-bonding and eutectic die-bonding, the LED die-bonding methods with a magnetic field according to the present invention have the following advantages. It eliminates the need for baking the first epoxy required in the epoxy die-bonding, therefore saving time and cost. In addition, this method results in superior heat dissipation properties compared to the epoxy die-bonding. This method is also less expensive than the eutectic die-bonding since a magnetic material is less expensive than Au or Au—Sn alloy, and the interior surface of the bottom of the packaging cup does not need to be coated with Au or Ag. Furthermore, this method only requires a magnetic field, thus eliminating the need for expensive equipment required in eutectic die-bonding.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method of light-emitting-diode (LED) die-bonding, comprising the steps of:
    coating the back side of an LED chip with a magnetic material;
    placing the LED chip in a packaging cup having a bottom such that the back side of the LED chip is in contact with the bottom of the packaging cup;
    applying a magnetic field in a region near the bottom of the packaging cup so as to exert a magnetic force on the LED chip via the magnetic material coated on the back side of the LED chip, thereby holding the LED chip in place against the bottom of the packaging cup;
    while the magnetic field is applied, bonding one end of a first conductive wire to an anode of the LED and the other end of the first conductive wire to a first electrode, and bonding one end of a second conductive wire to a cathode of the LED and the other end of the second conductive wire to a second electrode, wherein the first electrode and the second electrode are attached to the packaging cup;
    removing the magnetic field;
    filling the packaging cup with an epoxy; and
    curing the epoxy.

2. The method of claim 1, wherein the applying step comprises turning on an electromagnet, and the removing step comprises turning off the electromagnet.

3. The method of claim 1, wherein the applying step comprises placing a permanent magnet under the packaging cup, and the removing step comprises removing the permanent magnet away from the packaging cup.

4. The method of claim 1, wherein the curing step comprises baking the packaging cup with the LED chip and the epoxy therein at an elevated temperature for a duration of time effective for curing the epoxy.

5. The method of claim 1, wherein the first electrode and the second electrode are integrally formed in the packaging cup and are electrically insulated from each other by an insulating material.

6. The method of claim 1, further comprising the step of, before the coating step, coating the back side of the LED chip with a reflective material.

7. A method of LED die-bonding, comprising the steps of:
coating the back side of an LED chip with a magnetic material;
placing the LED chip in a packaging cup having a bottom such that the back side of the LED chip is in contact with the bottom of the packaging cup;
applying a magnetic field in a region near the bottom of the packaging cup so as to exert a magnetic force on the LED chip via the magnetic material coated on the back side of the LED chip, thereby holding the LED chip in place against the bottom of the packaging cup;
while the magnetic field is applied, bonding one end of a first conductive wire to an anode of the LED and the other end of the first conductive wire to a first electrode, and bonding one end of a second conductive wire to an cathode of the LED and the other end of the second conductive wire to a second electrode, wherein the first electrode and the second electrode are attached to the packaging cup;
while the magnetic field is applied, filling the packaging cup with an epoxy; and
while the magnetic field is applied, curing the epoxy, and removing the magnetic field.

8. The method of claim 7, wherein the coating step is performed using evaporation or sputtering.

9. The method of claim 7, wherein the applying step comprises turning on an electromagnet or placing a permanent magnet under the packaging cup.

10. The method of claim 7, wherein the first electrode and the second electrode are integrally formed in the packaging cup and are electrically insulated from each other by an insulating material.

11. The method of claim 7, further comprising the step of, before the coating step, coating the back side of the LED chip with a reflective material.

12. The method of claim 11, wherein the reflective material comprises aluminum (Al) or gold (Au).

13. The method of claim 11, wherein the reflective material is coated on the back side of the LED chip by using evaporation or sputtering.

14. A method of LED die-bonding, comprising the steps of:
placing an LED chip onto a substrate such that the back side of the LED chip is in contact with the substrate, wherein the back side of the LED chip is coated with a magnetic material;
applying a magnetic field in a region near the bottom of the substrate so as to exert a magnetic force on the LED chip via the magnetic material coated on the back side of the LED chip, thereby holding the LED chip in place against the substrate; and
while the magnetic field is applied, bonding one end of a first conductive wire to an anode of the LED and the other end of the first conductive wire to a first electrode, and bonding one end of a second conductive wire to an cathode of the LED and the other end of the second conductive wire to a second electrode, wherein the first electrode and the second electrode are attached to the substrate, and removing the magnetic field.

15. The method of claim 14, wherein the substrate is a submount, a heat sink, or a packaging cup.

16. The method of claim 14, wherein the magnetic material comprises iron (Fe), cobalt (Co), nickel (Ni), manganese (Mn), or any combination thereof.

17. The method of claim 14, wherein the placing step comprises positioning the LED chip in a predetermined position on the substrate.

18. The method of claim 14 further comprising the steps of, after the bonding steps:
dispensing an amount of epoxy over the LED chip; and
curing the epoxy.

19. The method of claim 18, wherein the dispensing and the curing steps are performed while the magnetic field is applied.

20. The method of claim 18, wherein the removing of the magnetic field occurs after the bonding steps and before the dispensing and the curing steps.

21. The method of claim 14, wherein the first electrode and the second electrode are integrally formed in the substrate and are electrically insulated from each other by an insulating material.

22. The method of claim 14, wherein the back side of the LED chip is coated with a reflective material under the magnetic material.

* * * * *